United States Patent [19]
Linder et al.

[11] Patent Number: 6,107,651
[45] Date of Patent: Aug. 22, 2000

[54] GATE TURN-OFF THYRISTOR WITH STOP LAYER

[75] Inventors: Stefan Linder, Zofingen; André Weber, Olten, both of Switzerland

[73] Assignee: Asea Brown Boveri AG, Baden, Switzerland

[21] Appl. No.: 09/124,892

[22] Filed: Jul. 30, 1998

[30] Foreign Application Priority Data

Oct. 24, 1997 [DE] Germany .................. 197 46 974

[51] Int. Cl.[7] ................................ H01L 29/744
[52] U.S. Cl. ............... 257/143; 257/147; 257/149
[58] Field of Search ........................ 257/139–153

[56] References Cited

U.S. PATENT DOCUMENTS 5,028,974   7/1991   Kitagawa .

FOREIGN PATENT DOCUMENTS

| | | |
|---|---|---|
| 0 061 046 | 9/1982 | European Pat. Off. . |
| 0 666 601 A2 | 8/1995 | European Pat. Off. . |
| 0 700 095 A2 | 3/1996 | European Pat. Off. . |
| 27 19 219 C2 | 9/1978 | Germany . |
| 31 09 892 A1 | 9/1982 | Germany . |
| 43 13 170 A1 | 10/1994 | Germany . |
| 44 31 294 A1 | 3/1996 | Germany . |
| 62-001273 | 1/1987 | Japan . |

*Primary Examiner*—David Hardy
*Attorney, Agent, or Firm*—Oblon, Spivak, McClelland, Maier & Neustadt, P.C.

[57] ABSTRACT

In a gate turn-off thyristor (GTO) with homogeneous anode, emitter and stop layer, a device which short-circuit the stop layer with the anode is provided in an edge termination region. As a result, in a reverse-biased state, the GTO has a structure of a diode in the edge region and amplification of a reverse current is obviated. With this structure, thermal loading in the edge region is reduced, as the GTO tolerates a higher operating temperature at a predetermined voltage.

5 Claims, 2 Drawing Sheets

GATE TURN-OFF THYRISTOR WITH STOP LAYER

BACKGROUND OF THE INVENTION

1. Field of the Invention

The invention is concerned with the field of power semiconductor technology. It is based on a gate turn-off thyristor or GTO according to the preamble of the first claim.

2. Discussion of Background

Such a GTO essentially comprises an npnp four-layer structure and also an anode-side stop layer and is described in the published German Patent Application DE 43 13 170 A1, for example. Further GTOs with stop layer are disclosed in the U.S. Pat. No. 5,028,974 and DE 44 31 294 A1.

Gate turn-off thyristors with stop layer and homogeneous anode emitter having low efficiency, as disclosed in said DE 43 13 170 A1, for example, are usually produced with a whole-area stop layer and a whole-area anode emitter. In the blocking state, a certain reverse current then flows between anode and gate of such an element. Charge carriers are produced in the space charge zone. The resulting holes flow away through the gate terminal and the electrons through the anode. With the whole-area design of stop layer and anode emitter, the reverse-biased GTO thus constitutes an open-base transistor. The electrons flowing away through the anode lead to a voltage drop across the anode emitter. This in turn leads to injection of holes. The reverse current generated in the space charge zone is thereby additionally amplified.

The reverse current leads to heating of the GTO. However, the cooling of the silicon wafer is reduced in the edge termination region. As a result, an uncontrolled temperature rise can occur in this region. This leads to a further rise in the reverse current. The overall result of the problems described is the possibility of thermal drifting and, at the worst, destruction of the element.

SUMMARY OF THE INVENTION

Accordingly, one object of the invention is to provide a novel gate turn-off thyristor (GTO) which is thermally stable particularly in its edge termination region and can be operated reliably in any operating state. This object is achieved by means of the features of the independent claims.

The heart of the invention, then, is that means which connect the stop layer to the anode are provided in the edge termination region. As a result, in the reverse-biased state the GTO has the structure of a diode in the edge region, and the amplification of the reverse current described in the introduction is obviated. Thermal loading in the edge region is reduced, and the component tolerates a higher operating temperature at a predetermined voltage.

A first exemplary embodiment is defined in that a short-circuit zone which is connected to the anode and short-circuits the stop layer with the anode is provided in the edge termination region. In a second exemplary embodiment, the anode emitter is not of whole-area design but rather is replaced, in the edge termination region, by the stop layer connected to the anode.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
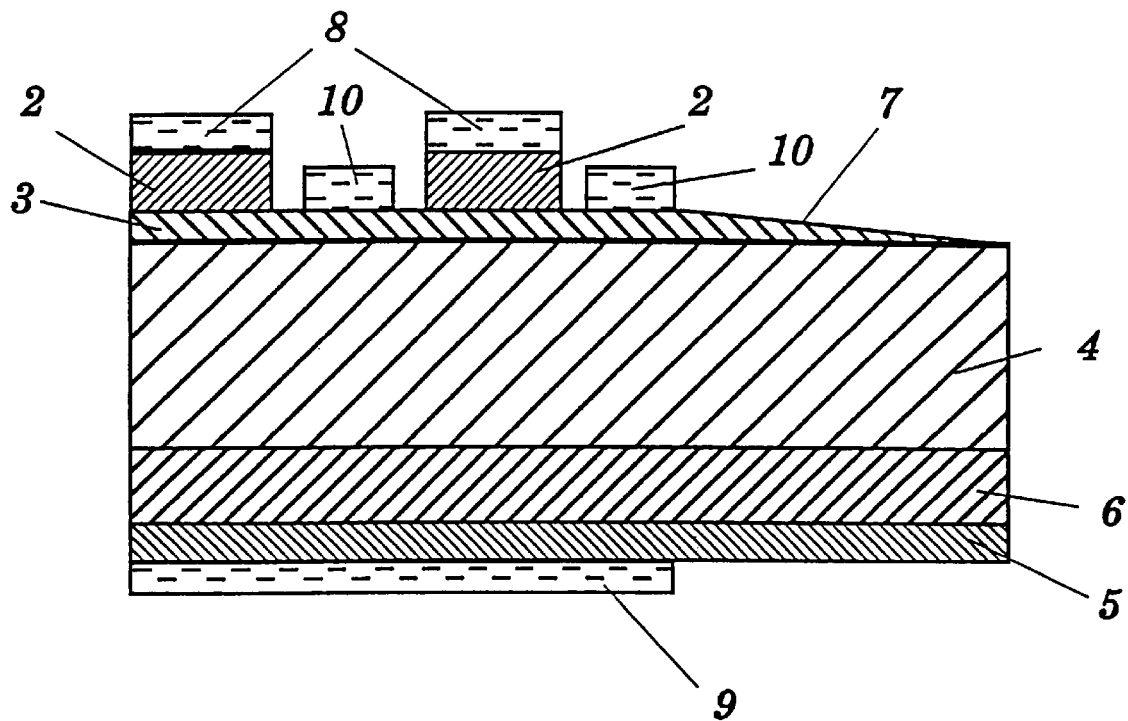
FIG. 1 shows a GTO with anode-side stop layer according to the prior art.

The reference numerals used in the drawings and their meanings are summarized in the List of Designations.

DESCRIPTION OF THE PREFERRED EMBODIMENTS

Referring now to the drawings, wherein like reference numerals designate identical or corresponding parts throughout the several views, FIG. 1 illustrates a detail of a gate turn-off thyristor or GTO according to the prior art. A number of differently doped layers, which essentially form an npnp thyristor structure, are arranged in a semiconductor body. N-doped regions are hatched by lines running from the top right to the bottom left, p-doped regions by lines running from the top left to the bottom right, and metallization layers by horizontal short dashes. The denseness of the hatching may be understood to be an indication of the doping strength. An anode-side main area is followed by a $p^+$-doped anode emitter 5, an n-doped stop layer 6, an $n^-$-doped n-type base 4, a p-doped p-type base 3 and $n^+$-doped cathode emitter regions 2. A metallization layer forming a cathode 8 makes contact with said cathode emitter regions. The cathode emitter regions 2 may be elevated as illustrated or else integrated in the p-type base 3. Between the cathode emitter regions 2, a metallization layer forming a gate 10 makes contact with the p-type base 3. In order to avoid excessive field increases at the edge of the GTO and to render the component secure for high voltages, a so-called edge termination region 7 is provided at the edge. In this region, cathode emitters 2 are not present and the semiconductor wafer may be bevelled, in particular.

Such gate turn-off thyristors with a stop layer 6 and a homogeneous anode emitter 5 are produced nowadays with a whole-area stop layer 6 and a whole-area anode emitter 5. In addition, the anode emitter 5 preferably has a low efficiency. In the blocking state, a certain reverse current then flows between anode and gate of such an element. Charge carriers are produced in the space charge zone. The resulting holes flow away through the gate terminal and the electrons through the anode. With the whole-area design of stop layer and anode emitter, the reverse-biased GTO thus constitutes an open-base transistor. The electrons flowing away through the anode lead to a voltage drop across the anode emitter. This in turn leads to an injection of holes. The reverse current generated in the space charge zone is thereby additionally amplified.

The reverse current leads to heating of the GTO. However, the cooling of the silicon wafer is reduced in the edge termination region. As a result, an uncontrolled temperature rise can occur in this region. This leads to a further rise in the reverse current. The overall result of the problems described is the possibility of thermal drifting and, at the worst, destruction of the element.

Figure 2:
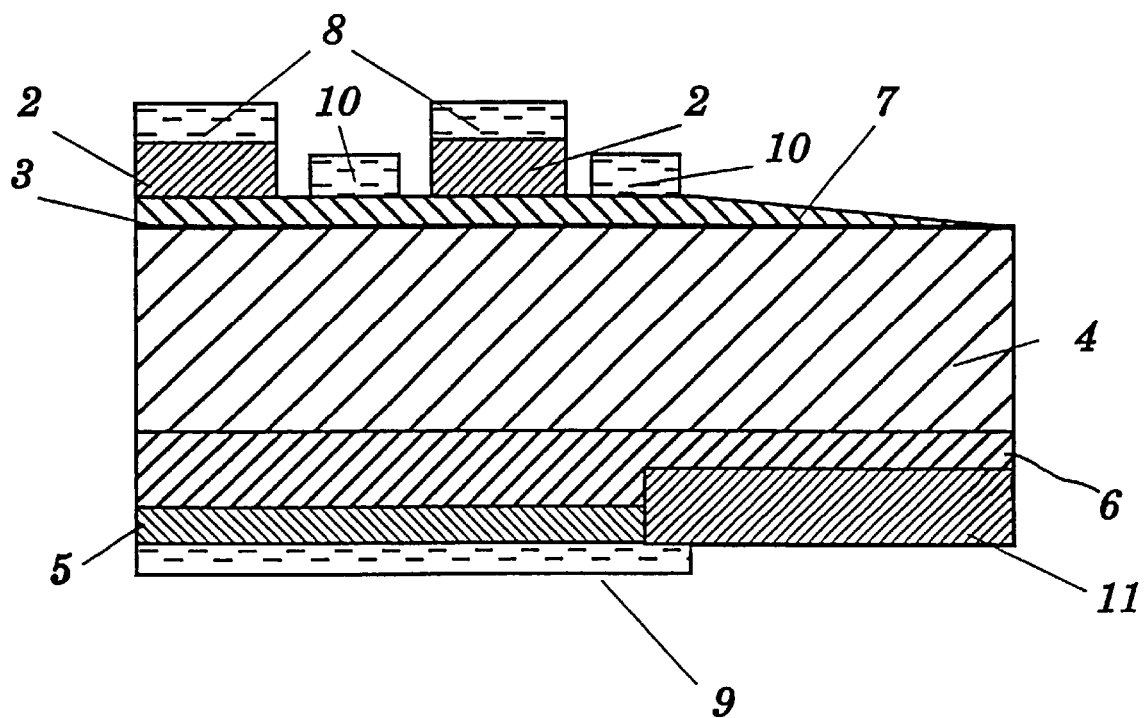
FIG. 2 shows an inventive GTO according to a first exemplary embodiment.
Figure 3:
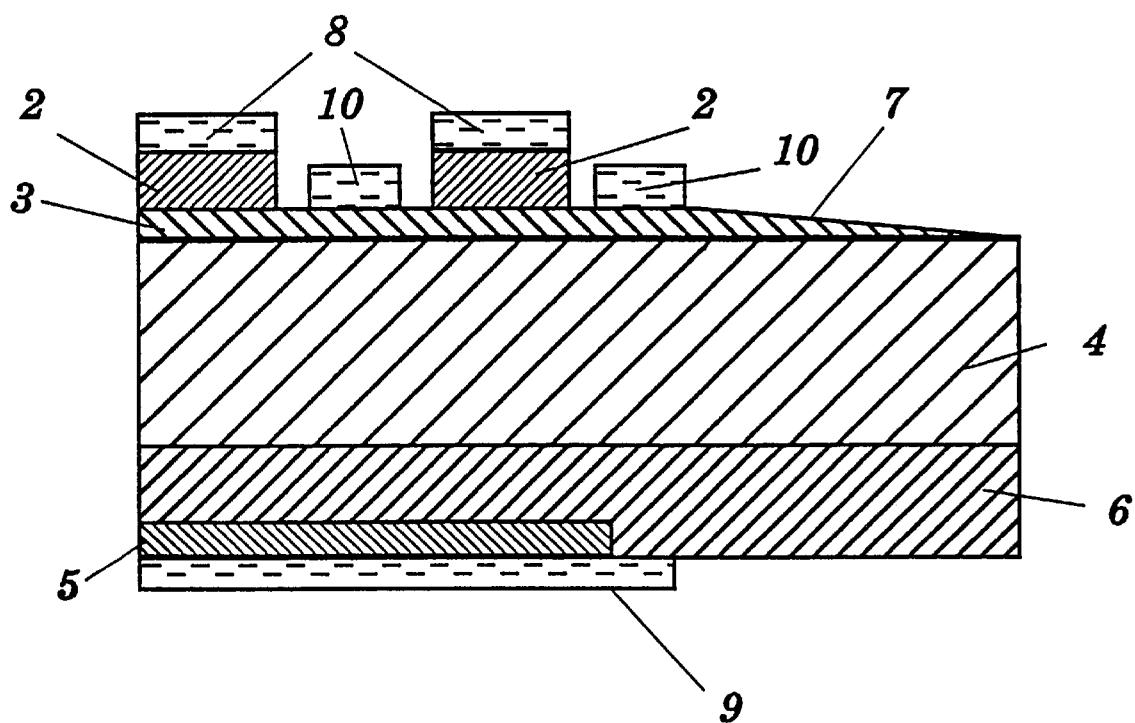
FIG. 3 shows an inventive GTO according to a second exemplary embodiment.

Therefore, according to the invention, means which connect the stop layer to the anode are provided in the edge termination region, as shown in FIGS. 2 and 3. In accordance with the exemplary embodiment according to FIG. 2, the means comprise a short-circuit zone 11, which is connected to the stop layer 6 and short-circuits the latter with the anode 9. The doping of the short-circuit zone 11 must at least compensate for the doping of the anode emitter 5. That is to say the short-circuit zone will generally be $n^+$-doped. The reverse-biased structure in the edge termination region 7 is thus a diode. Consequently, the reverse current is not amplified in this region. The thermal loading in the edge region is thus reduced. Accordingly, the operating temperature at a predetermined voltage can be increased.

FIG. 3 shows another solution. In this case, the anode emitter 5 is not of whole-area design, with the result that the stop layer 6 penetrates as far as the anode-side main area and the anode 9 makes contact with said stop layer. Consequently, the stop layer 6 is short-circuited with the anode 9 in this case, too. The short-circuit can, for example, be implemented at the same time as the formation of the cathode-side emitter. Overall, the invention affords a GTO which can be more highly thermally loaded, is thus more robust and requires less cooling. The GTO according to the invention is thermally stable particularly in its edge termination region and can be operated reliably in any operating state.

Obviously, numerous modifications and variations of the present invention are possible in light of the above teachings. It is therefore to be understood that within the scope of the appended claims, the invention may be practised otherwise than as specifically described herein.

What is claimed as New and Desired to be Secured by Letters Patent of the United States is:

1. A gate turn-off thyristor (GTO), comprising:
   a) in a semiconductor body, an npnp four-layer structure having cathode emitter regions, a p-type base, an e-type base and a homogeneous anode emitter;
   b) a stop layer, which is more heavily doped than the n-type base and is arranged between the n type base and the anode emitter;
   c) a bevelled edge termination region, which has no cathode emitter regions;
   d) a cathode, which makes contact with the cathode emitter regions, an anode, which makes contact with the anode emitter, and a gate which makes contact with the p-type base;
   wherein
   e) a means which connects the stop layer to the anode emitter and which short-circuits the stop layer with the anode is provided in the edge termination region.

2. The GTO as claimed in claim 1, wherein the connecting means comprises a short-circuit zone, which is connected to the anode and short-circuits the stop layer with the anode, and is provided in the edge termination region.

3. The GTO as claimed in claim 1, wherein the anode emitter is not of a whole-area design and, in the edge termination region, is replaced by the stop layer connected to the anode.

4. The GTO as claimed in claim 3, wherein the connecting means comprises a short-circuit zone, which is connected to the anode and short-circuits the stop layer with the anode, and is provided in the edge termination region.

5. The GTO as claimed in claim 2, wherein the anode emitter is not of a whole-area design and, in the edge termination region, is replaced by the stop layer connected to the anode.

* * * * *